United States Patent
West et al.

(10) Patent No.: US 10,781,518 B2
(45) Date of Patent: Sep. 22, 2020

(54) GAS COOLED ELECTROSTATIC CHUCK (ESC) HAVING A GAS CHANNEL FORMED THEREIN AND COUPLED TO A GAS BOX ON BOTH ENDS OF THE GAS CHANNEL

(71) Applicant: Applied Materials, Inc., Santa Clara, CA (US)

(72) Inventors: Brian T. West, San Jose, CA (US); Manoj A. Gajendra, Bangalore (IN); Soundarrajan Jembulingam, Lalgudi (IN)

(73) Assignee: Applied Materials, Inc., Santa Clara, CA (US)

( * ) Notice: Subject to any disclaimer, the term of this patent is extended or adjusted under 35 U.S.C. 154(b) by 410 days.

(21) Appl. No.: 14/567,161

(22) Filed: Dec. 11, 2014

(65) Prior Publication Data

US 2016/0172226 A1 Jun. 16, 2016

(51) Int. Cl.
*H01L 21/67* (2006.01)
*C23C 16/46* (2006.01)
*H01L 21/683* (2006.01)
*C23C 16/458* (2006.01)
*C23C 14/50* (2006.01)
*H01J 37/32* (2006.01)

(52) U.S. Cl.
CPC .............. *C23C 16/46* (2013.01); *C23C 14/50* (2013.01); *C23C 16/4586* (2013.01); *H01J 37/32697* (2013.01); *H01J 37/32715* (2013.01); *H01J 37/32724* (2013.01); *H01L 21/67109* (2013.01); *H01L 21/67248* (2013.01); *H01L 21/6831* (2013.01)

(58) Field of Classification Search
CPC ................................. H01J 37/32715
See application file for complete search history.

(56) References Cited

U.S. PATENT DOCUMENTS

| | | | | |
|---|---|---|---|---|
| 5,958,265 A | * | 9/1999 | Ogahara | ............. H01L 21/6831 118/725 |
| 7,480,129 B2 | * | 1/2009 | Brown | ................ H01L 21/6831 361/234 |
| 2004/0035530 A1 | | 2/2004 | Ilzuka | |
| 2007/0165356 A1 | * | 7/2007 | Nguyen | ............ H01L 21/67109 361/234 |

(Continued)

FOREIGN PATENT DOCUMENTS

| | | |
|---|---|---|
| CN | 101093812 A | 12/2007 |
| CN | 102160167 A | 8/2011 |

OTHER PUBLICATIONS

International Search Report and Written Opinion of the International Searching Authority for PCT/US2015/059065 dated Feb. 22, 2016 (10 pgs).

(Continued)

*Primary Examiner* — Anh D Mai

(74) *Attorney, Agent, or Firm* — Patterson + Sheridan, LLP

(57) ABSTRACT

Embodiments of the disclosure include an electrostatic chuck assembly, a processing chamber and a method of maintaining a temperature of a substrate is provided. In one embodiment, an electrostatic chuck assembly is provided that includes an electrostatic chuck, a cooling plate and a gas box. The cooling plate includes a gas channel formed therein. The gas box is operable to control a flow of cooling gas through the gas channel.

17 Claims, 5 Drawing Sheets

(56) References Cited

U.S. PATENT DOCUMENTS

| | | | |
|---|---|---|---|
| 2009/0274590 A1 | 11/2009 | Willwerth et al. | |
| 2009/0294101 A1* | 12/2009 | Fovell | F28D 15/00 |
| | | | 165/104.19 |
| 2010/0163188 A1 | 7/2010 | Tanaka et al. | |
| 2011/0147363 A1 | 6/2011 | Yap et al. | |
| 2012/0091104 A1 | 4/2012 | Tavassoli et al. | |
| 2012/0285619 A1 | 11/2012 | Matyushkin et al. | |
| 2012/0311858 A1* | 12/2012 | Reitinger | G01R 31/2874 |
| | | | 29/837 |
| 2012/0321848 A1* | 12/2012 | Richardson, III | B64C 1/40 |
| | | | 428/138 |
| 2015/0262798 A1* | 9/2015 | Binns | H01J 37/3476 |
| | | | 204/298.03 |

OTHER PUBLICATIONS

Office Action from Chinese Patent Application No. 201580063578.4 dated Jun. 28, 2020.

* cited by examiner

GAS COOLED ELECTROSTATIC CHUCK (ESC) HAVING A GAS CHANNEL FORMED THEREIN AND COUPLED TO A GAS BOX ON BOTH ENDS OF THE GAS CHANNEL

BACKGROUND OF THE DISCLOSURE

Field

Embodiments of the disclosure generally relate to the manufacturing of semiconductor devices. More particularly, embodiments relate to cooling an electrostatic chuck during the manufacturing of semiconductor devices.

Description of the Background Art

Microelectromechanical systems (MEMS) are very small devices manufactured by semiconductor processing systems for use in various electronic devices throughout the world. Aluminum nitride (AlN) is a material commonly used in MEMS devices, and physical vapor deposition (PVD) processes are one of the favored manufacturing techniques employed for producing quality MEMS devices in quantity on a substrate.

During an AlN PVD process, the substrate is supported on a ceramic electrostatic chuck (ESC) which is maintained at temperatures of about 400 degrees Celsius. In order to reliably produce MEMS devices, the process requires minimal variation in the process temperature. Existing ESC assemblies are designed to use de-ionized water (DIW) cooling systems to minimize the temperature variation in the AlN PVD process. However, conventional DIW cooling systems have not been able to maintain a stable temperature for the ESC in a PVD chamber over the course of a fabrication run that processes multiple substrates at high power and high temperatures. The temperature of the ESC begins to trend upward after only several substrates have undergone the AlN PVD process while manufacturing the MEMS. Substrates subsequently processed later in the fabrication run are subject to higher temperatures then earlier substrates. The temperature increases rapidly and this rapid variation in the temperature affect the stress of films deposited on the substrate. Additionally, at temperatures of 400 degrees Celsius and greater, the use of de-ionized water to cool the ESC may create a thermal shock, damaging the ceramic ESC. Thus, conventional ESC's are not suitable for reliably processing MEMS devices at temperatures of 400 degrees Celsius and greater.

Therefore, there is a need for an improved ESC.

SUMMARY

Embodiments of the disclosure include an electrostatic chuck assembly, a processing chamber and a method of maintaining a temperature of a substrate is provided. In one embodiment, an electrostatic chuck assembly is provided that includes an electrostatic chuck, a cooling plate and a gas box. The cooling plate includes a gas channel formed therein. The gas box is operable to control a flow of cooling gas through the gas channel.

In another embodiment, a processing chamber is provided that includes a chamber body, a gas cooled electrostatic chuck assembly, and a gas box. The chamber body has walls, a lid and a bottom which defines an interior processing volume. The gas cooled electrostatic chuck assembly is disposed in the processing volume of the chamber body, the gas cooled electrostatic chuck assembly having a cooling plate. The cooling plate has a gas channel with a first end and a second end. The a gas box is configured to control a flow of a cooling gas to the first end of the gas channel in the cooling plate and receive the cooling gas from the second end of the gas channel in the cooling plate.

In another embodiment, a method for cooling a gas cooled electrostatic chuck assembly is provided that includes supplying a cooling gas to a gas box, flowing the cooling gas from the gas box through a cooling plate coupled to an electrostatic chuck, running the cooling gas from the cooling plate to the gas box; and running the cooling gas through a heat exchanger in the gas box to cool the cooling gas.

BRIEF DESCRIPTION OF THE DRAWINGS

So that the manner in which the above-recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The throughput for manufacturing quality MEMS devices using AlN deposited in a PVD chamber may be enhanced by reducing temperature variation in an electrostatic chuck (ESC) utilized in the PVD chamber to support a substrate on which the AlN layer is deposited. The temperature variation of the ESC may be reduced by cooling the ESC with a gas. The ESC assembly and/or a cooling plate on which the ESC is supported utilize a gas cooling arrangement with controlled gas flow ($N_2$ or clean dry air (CDA), among others) and system interlocks to ensure gas flow and to limit the temperature variation on ESC/substrate to within about ±7.5 degrees Celsius. Additionally, other deposition applications having high temperatures, such as temperatures exceeding 400 degrees Celsius and even temperatures up near 1000 degrees Celcius, have shown to benefit from the ESC with the gas cooling to limit temperature variations to within ±7.5 degrees Celsius.

Figure 1:
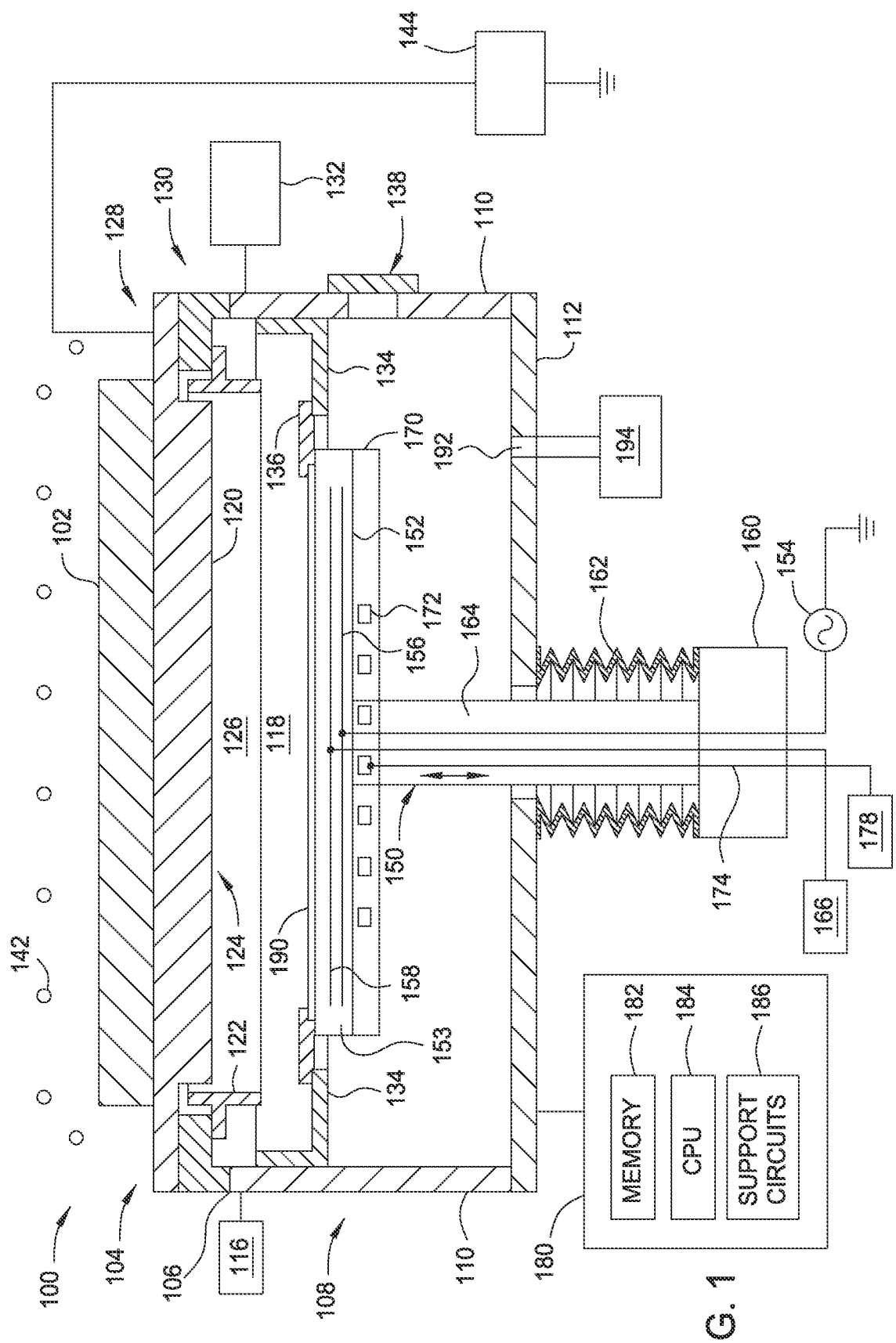
FIG. 1 is a schematic sectional view of a processing chamber having a gas cooled electrostatic chuck.

FIG. 1 illustrates an exemplary process chamber 100 (e.g., a physical vapor deposition (PVD) or sputter process chamber, or a chemical deposition chamber (CVD)). The process chamber 100 may be suitable for high temperature operation that require minimal temperature variations. The process chamber 100 may be a PVD chamber suitable for sputter deposition of aluminum nitride (AlN) materials on a substrate 190, for example during the fabrication of MEMS. However, it should be appreciated that the process chamber 100 may be a CVD chamber or other chamber suitable for applications desiring limited temperature variations on materials processed therein.

The process chamber 100 includes a chamber body 108 having a processing volume 118 defined therein. The chamber body 108 has sidewalls 110 and a bottom 112. The dimensions of the chamber body 108 and related components of the process chamber 100 are not limited and generally are proportionally larger than the size of the substrate 190 to be processed therein. However, as any suitable substrate size may be processed, the process chamber 100 may be sized accordingly. Examples of suitable substrate sizes include substrate with 200 mm diameter, 100 mm diameter or 450 mm diameter.

A chamber lid assembly 104 is mounted on the top of the chamber body 108. The chamber body 108 may be fabricated from stainless steel, aluminum, or other suitable materials. A substrate access port 138 is formed through the sidewall 110 of the chamber body 108, facilitating the transfer of a substrate 190 into and out of the process chamber 100. The access port 138 may be coupled to a transfer chamber and/or other chambers of a substrate processing system.

A substrate support 150 is disposed inside the chamber body 108. The substrate support 150 is movable to control the spacing between the top of the substrate support 150 and the chamber lid assembly 104. The substrate support 150 includes a gas cooled electrostatic chuck (ESC) 152 and a cooling plate 170, both of which are further described below.

A gas source 132 is coupled to the chamber body 108 to supply process gases into the processing volume 118. In one embodiment, process gases may include inert gases, non-reactive gases, and reactive gases if necessary. Examples of process gases that may be provided by the gas source 132 include, but not limited to, argon gas (Ar), helium (He), neon gas (Ne), krypton (Kr), xenon (Xe), nitrogen gas ($N_2$), oxygen gas ($O_2$), hydrogen gas ($H_2$), ammonia ($NH_3$), methane ($CH_4$), carbon monoxide (CO), and/or carbon dioxide ($CO_2$), among others. In one embodiment, the gas source 132 supplies $N_2$ and Ar into the chamber volume.

After the process gas is introduced into the process chamber 100, the gas is energized to form plasma. An antenna 142, such as one or more inductor coils, may be provided adjacent the process chamber 100. An antenna power supply (not shown) may power the antenna 142 to inductively couple energy, such as RF energy, to the process gas to form plasma in a process zone defined in the process chamber 100 between the substrate support 150 and the lid assembly 104. Alternatively, or in addition, process electrodes comprising a cathode below the substrate 190 and an anode above the substrate 190 may be used to couple RF power to generate plasma. A controller 180 that also controls the operation of other components in the process chamber 100 may control the operation of the antenna power supply.

A pumping port 192 is formed through the bottom 112 of the chamber body 108. A pumping device 194 is coupled to the processing volume 118 to evacuate and control the pressure therein. A pumping system and chamber cooling design enables high base vacuum (1E-8 Torr or less) and low rate-of-rise (1,000 mTorr/min) at temperatures suited to thermal budget needs, e.g., 25° C. to +1000° C. The pumping system is designed to provide precise control of the process pressure.

The lid assembly 104 generally includes a target 120 and a ground shield assembly 130 coupled thereto. The target 120 provides a material source that can be sputtered and deposited onto the surface of the substrate 190 during a PVD process. Target 120 serves as the cathode of the plasma circuit during DC sputtering.

The target 120 (or target plate) may be fabricated from a material utilized for the deposition layer, or elements of the deposition layer to be formed in the process chamber 100. A high voltage power supply, such as a power source 144, is connected to the target 120 to facilitate sputtering materials from the target 120. The target 120 may be fabricated from a material containing silicon (Si), titanium (Ti) metal, tantalum metal (Ta), hafnium (Hf), tungsten (W) metal, cobalt (Co), nickel (Ni), copper (Cu), aluminum (Al), alloys thereof, combinations thereof, or the like. Additionally, the electron emission from the target during processing may be controlled by n-type or p-type doping of the target. The target may be doped with a conducting element such as Boron (B). In one embodiment, the target may include an Al alloy for generating Al ions which combine with the nitrogen ions on the substrate 190 to form an AlN layer.

The target 120 generally includes a peripheral portion 128 and a central portion 124. The peripheral portion 128 is disposed over the sidewalls 110 of the chamber. The central portion 124 of the target 120 may have a curvature surface slightly extending towards the surface of the substrate 190 disposed on the substrate support 150. The spacing between the target 120 and the substrate support 150 is maintained between about 50 mm and about 150 mm. It is noted that the dimension, shape, materials, configuration and diameter of the target 120 may be varied for specific process or substrate requirements. The target 120 may also include adjacent tiles or segmented materials that together form the target.

The lid assembly 104 may further comprise a magnetron cathode 102 mounted above the target 120 which enhances efficient sputtering materials from the target 120 during processing. The magnetron cathode 102 allows easy and fast process control and tailored film properties while ensuring consistent target erosion and uniform deposition of a film, such as AlN, across the substrate 190. Examples of the magnetron assembly include a linear magnetron, a serpentine magnetron, a spiral magnetron, a double-digitated magnetron, a rectangularized spiral magnetron, among others.

The ground shield assembly 130 of the lid assembly 104 includes a ground frame 106 and a ground shield 122. The ground shield assembly 130 may also include other chamber shield member, target shield member, dark space shield, and dark space shield frame. The ground shield 122 is coupled to the peripheral portion 128 by the ground frame 106 defining an upper processing region 126 below the central portion of the target 120 in the processing volume 118. The ground frame 106 electrically insulates the ground shield 122 from the target 120 while providing a ground path to the chamber body 108 of the process chamber 100 through the sidewalls 110. The ground shield 122 constrains plasma generated during processing within the upper processing region 126 and dislodges target source material from the confined central portion 124 of the target 120, thereby allowing the dislodged target source to be mainly deposited on the substrate surface rather than chamber sidewalls 110. In one embodiment, the ground shield 122 may be formed by one or more work-piece fragments and/or a number of these pieces bonding by processes known in the art, such as welding, gluing, high pressure compression, etc.

The controller 180 is coupled to the process chamber 100. The controller 180 includes a central processing unit (CPU) 184, a memory 182, and support circuits 186. The controller 180 is utilized to control the process sequence, regulating the gas flows from the gas source 132 into the process chamber 100 and controlling ion bombardment of the target 120. The CPU 184 may be of any form of a general purpose computer processor that can be used in an industrial setting. The software routines can be stored in the memory 182, such as random access memory, read only memory, floppy or hard disk drive, or other form of digital storage. The support circuits 186 are conventionally coupled to the CPU 184 and may comprise cache, clock circuits, input/output subsystems, power supplies, and the like. The software routines, when executed by the CPU 184, transform the CPU into a specific purpose computer (controller) 180 that controls the process chamber 100 such that the processes are performed in accordance with the present invention. The software routines may also be stored and/or executed by a second controller (not shown) that is located remotely from the process chamber 100.

During processing, material is sputtered from the target 120 and deposited on the surface of the substrate 190. The target 120 and the substrate support 150 are biased relative to each other, and/or relative to ground, by the power source 144 to maintain a plasma formed from the process gases supplied by the gas source 132. The ions from the plasma are accelerated toward and strike the target 120, causing target material to be dislodged from the target 120. The dislodged target material and reactive process gases together form a layer on the substrate 190 with desired compositions. RF, DC or fast switching pulsed DC power supplies or combinations thereof provide tunable target bias for precise control of sputtering composition and deposition rates for the AlN material.

A shaft 164 extending through the bottom 112 of the chamber body 108 couples to a lift mechanism 160. The lift mechanism 160 is configured to move the substrate support 150 between a lower transfer position and an upper processing position. A bellows 162 circumscribes the shaft 164 and coupled to the substrate support 150 to provide a flexible seal there between, thereby maintaining vacuum integrity of the processing volume 118 for the process chamber 100.

As discussed above, the substrate support 150 contain the electro-static chuck (ESC) having a chuck electrode 158. The ESC 152 uses the attraction of opposite charges to hold both insulating and conducting substrates 190 during processing and is powered by DC power supply 166. The ESC 152 comprises the chuck electrode 158 embedded within a dielectric body 153. The DC power supply 166 may provide a DC chucking voltage of about 200 to about 2000 volts to the chuck electrode 158. The DC power supply 166 may also include a system controller 180 for controlling the operation of the chuck electrode 158 by directing a DC current to the electrode for chucking and de-chucking the substrate 190.

In some embodiments, it is also desirable to separately apply a bias to the substrate 190 during different phases of the layer deposition process. Therefore, a bias may be provided to a bias electrode 156 (or chuck electrode 158) in the substrate support 150 from a source 154 (e.g., DC and/or RF source), so that the substrate 190 will be bombarded with ions formed in the plasma during one or more phase of the deposition process.

A shadow frame 136 is disposed on the periphery region of the substrate support 150 and is configured to confine deposition of source material sputtered from the target 120 to a desired portion of the substrate surface. A chamber shield 134 may be disposed on the inner wall of the chamber body 108 and have a lip extending inward to the processing volume 118 configured to support the shadow frame 136 disposed around the substrate support 150. As the substrate support 150 is raised to the upper position for processing, an outer edge of the substrate 190, disposed on the substrate support 150, is engaged by the shadow frame 136 and the shadow frame 136 is lifted up and spaced away from the chamber shield 134. When the substrate support 150 is lowered to the transfer position adjacent to the substrate transfer access port 138, the shadow frame 136 is set back on the chamber shield 134. Lift pins (not shown) are selectively moved through the substrate support 150 to lift the substrate 190 above the substrate support 150 to facilitate access to the substrate 190 by a transfer robot or other suitable transfer mechanism.

As discussed above, the substrate support 150 may include the cooling plate 170. The cooling plate 170 is disposed in contact with the underside of the ESC 152. The cooling plate 170 is utilized to control the temperature of the ESC 152, and thus the substrate 190 disposed on the ESC 152. The cooling plate 170 may be coupled to, or be a part of, the ESC 152. The cooling plate 170 is connected to a gas cooling box 178 by cooling lines 174. The gas cooling box 178 may provide a primary heat transfer fluid, such as a gas, which is circulated through the cooling plate 170 before returning back to the gas cooling box 178. The cooling plate 170 may have one or more conduits 172 disposed therein. The primary heat transfer fluid flowing through neighboring conduits 172 may be isolated to enabling local control of the heat transfer between the ESC 152 and different regions of the cooling plate 170, which assists in controlling the lateral temperature profile of the substrate 190. The conduits 172 may connect to a manifold to the cooling lines 174 or may each have individual cooling lines 174 for providing the primary heat transfer fluid to and from the cooling plate 170.

The cooling plate 170 may keep the temperature of the substrate 190 on the ESC 152 below the temperature at which films may become volatile and contaminate the process chamber 100. The cooling plate 170 keeps the ESC 152 within a stable temperature range for forming MEMS devices by AlN PVD. Thus, the cooling plate 170 reduces the manufacturing defects and downtime for the process chamber 100 from chamber contamination and/or damage to the ESC.

Figure 2:
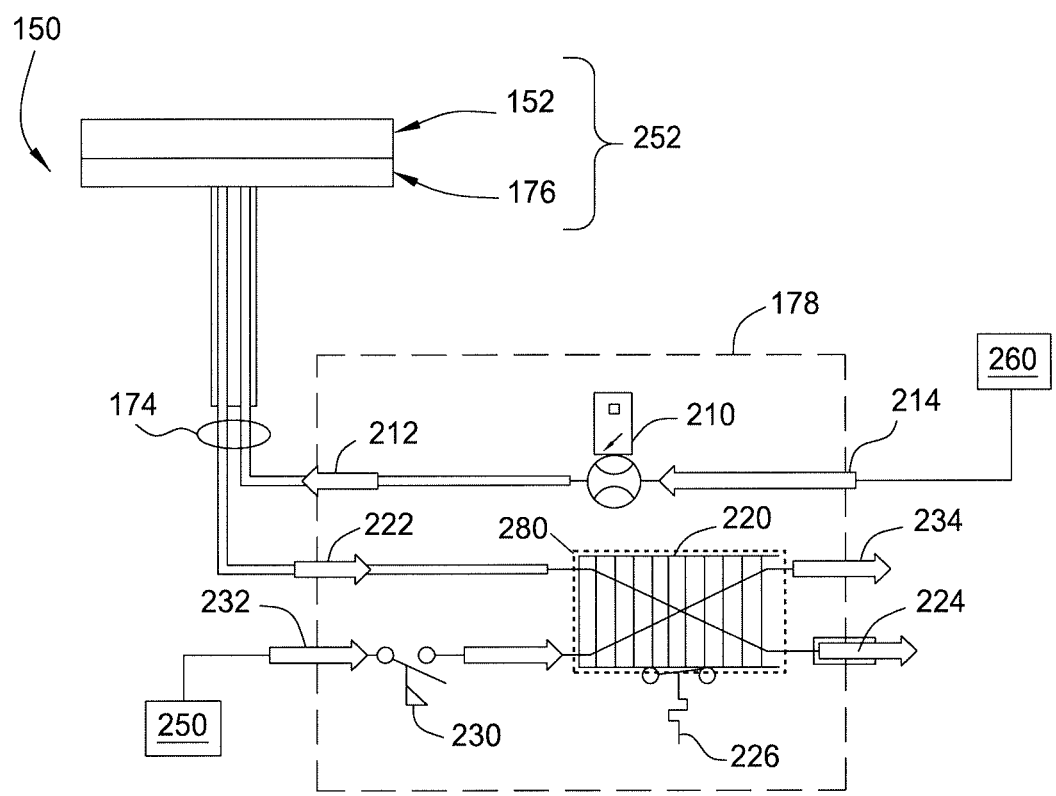
FIG. 2 is a schematic for the gas cooling arrangement for an electrostatic chuck.

FIG. 2 is a high level schematic diagram of a gas cooling arrangement 200 for the ESC 152. The gas cooling arrangement 200 includes a gas cooled ESC assembly 252 and the gas cooling box 178. The ESC assembly 252 is part of the substrate support 150 and the ESC assembly 252 is connected to the gas cooling box 178 by the cooling lines 174. The ESC assembly 252 includes the ESC 152 and the cooling plate 176. The cooling lines 174 may include one or more cooling gas return lines and one or more cooling gas supply lines. In one embodiment, the cooling lines 174 has two gas return lines and two corresponding gas supply lines which are fluidly separated from each other. The cooling gas supply lines provide the primary heat transfer fluid, also referred to herein as a cooling gas, to the gas cooled ESC assembly 252. The temperature of the cooling gas rises as the cooling gas travels through and removes heat from the gas cooled ESC assembly 252. The cooling gas, now heated, is returned from the gas cooled ESC assembly 252 via the cooling lines 174 to the gas cooling box 178 by way of the gas return inlet 222.

The gas cooling box 178 may have several connections for connecting and moving fluids therein. The gas cooling box 178 may have a source cooling gas inlet 214 and a source cooling gas outlet 212. A cooling gas source 260 may provide a cooling gas, such as $N_2$, He or other suitable gas, to the source cooling gas inlet 214. The cooling gas may be provided at a temperature of about 30 degrees Celsius. The cooling gas enters the gas cooling box 178 at the source cooling gas inlet 214 and exits at the source cooling gas outlet 212. The source cooling gas outlet 212 is fluidly attached to the cooling lines 174 and the cooling gas leaving the source cooling gas outlet 212 enters the cooling plate 176. The cooling gas may be of a temperature suitable for regulating the temperature of the gas cooled ESC assembly 252 by transferring heat from the gas cooled ESC assembly 252 to the cooling gas.

The gas cooling box 178 may have a flow control valve 210. The flow of cooling gas ($N_2$) entering the source cooling gas inlet 214 is controlled by the flow control valve 210. The flow control valve 210 may be a variable gas flow control valve with sensors having digital input/output (I/O) ports for the setting the flow rate of the cooling gas. The I/O port may be attached to the controller 180. The flow control valve 210 may transmit flow information as well as system errors, such as if there is no set value for the flow of cooling gas, to the controller 180. The controller 180 may operate the flow control valve 210 to regulate the flow of the cooling gas out the source cooling gas outlet 212 to the gas cooled ESC assembly 252.

The gas cooling box 178 may also have a gas return inlet 222 and a return gas outlet 224. The cooling gas carries heat away from the gas cooled ESC assembly 252. The cooling gas leaves the gas cooled ESC assembly 252 via the cooling lines and enters the gas return inlet 222 of the gas cooling box 178. The cooling gas exits the return gas outlet 224 of the gas cooling box 178 and may be recycled or reused by the cooling gas source 260.

The gas cooling box 178 may additionally have a cooling fluid inlet 232 and a cooling fluid outlet 234. A cooling fluid source 250 may provide a secondary cooling fluid, such as deionized water (DIM or other suitable cooling fluid, to the cooling fluid inlet 232 of the gas cooling box 178. The secondary cooling fluid leaves the gas cooling box 178 via the cooling fluid outlet 234. The secondary cooling fluid leaving the cooling fluid outlet may be treated, such as a thermal treatment to remove heat, recycled and even reused by the cooling fluid source 250.

The gas cooling box 178 may have a heat exchanger 220 and optional thermostat 226. The heat exchanger 220 may be a non-contact heat exchanger or other suitable non-contact heat exchanger, such a shell and tube heat exchanger. Additionally, the gas cooling box 178 may have a flow switch 230. The cooling gas returning from the gas cooled ESC assembly 252 may be warmed to a temperature of about 200 degrees Celsius. The heated cooling gas enters the gas cooling box 178 at the gas return inlet 222 and passes through the heat exchanger 220. The flow switch 230 may regulate the flow of the secondary cooling fluid from the cooling fluid source 250. The flow switch 230 may also have an inter lock and 10 port to sense flow of the secondary cooling fluid and communicate with the controller 180. The flow switch regulates secondary cooling fluid coming in from the cooling fluid inlet 232 and entering the heat exchanger 220. The heat exchanger 220 may also have a flow switch with an interlock for sensing the secondary cooling fluid, as well as an I/O port for communicating with the controller 180. Additionally, the heat exchanger may have a thermal switch, such as a bimetal thermal switch, on the heat exchanger 220 to sense an overheat condition such as when there is no flow of secondary cooling fluid in the heat exchanger 220. The heat exchanger may be isolated from the gas cooling box 178 with fluoropolymer pads 280 to minimize heat transfer between the heat exchanger 220 and the gas cooling box 178, as well as isolating RF power from the gas cooled ESC assembly 252. The heat exchanger 220 may cool the heated cooling gas down to about 30 degrees Celsius. The now cooled cooling gas may be exhausted from the gas cooling box 178 via return gas outlet 224. In one embodiment, the controller 180 monitors the thermostat 226 and regulates the flow switch 230 and flow control valve 210 to provide cooling gas to the cooling plate 176 at a rate and temperature suitable for maintaining the gas cooled ESC assembly 252 within +/−7.5 degrees Celsius of a desired step point temperature. In one example, the desired step point temperature may be between about 400 degrees Celsius to about 410 degrees Celsius.

To achieve efficient heat transfer between the substrate (not shown) and the cooling plate 176, gas cooling channels 310 are present in the cooling plate 176.

Figure 3:
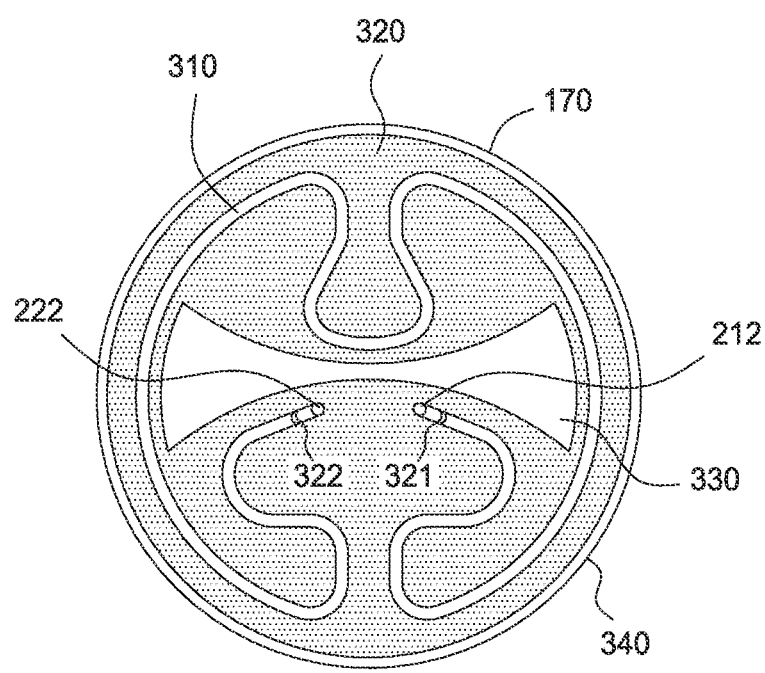
FIG. 3 is a bottom plan view for a cooling plate in the gas cooled electrostatic chuck.

FIG. 3 is a bottom plan view of the cooling plate 176 of the gas cooled electrostatic chuck assembly 252. The cooling plate 176 may be formed from copper (Cu), stainless steel (SST) or other thermally conductive material or mixture of materials. In one embodiment, the gas cooling channels 310 may be grooves formed in a plate, such as a copper plate 320. The copper plate 320 may be brazed or bonded to, or pressed against the ESC 152 in the formation of the gas cooled ESC assembly 252. Alternately, the copper plate 320 may be brazed or bonded to, or pressed against a second plate, such as a SST plate 340, prior to assembly with the ESC 152. Additionally, a thermally conductive gasket material may be placed between the face of the copper plate 320 and the backside (underside) of the ceramic ESC 152 to better couple the thermal transfer of heat to the copper plate 320 and to eliminate the variations in temperature profile resulting from inadequately coupled thermal contact. The cooling plate 176 may have one or more open areas 330 for instrumentation and other control lines, such as wire leads, to pass therethrough to the ESC 152.

The gas cooling channels 310 in the cooling plate 176 may have a first end 312 and a second end 322. The cooling lines 174 may attach to the first and second ends 312, 322. The cooling gas may flow from the cooling lines 174 into the first end 312 and exit the second end 322. Although the cooling plate 170 is shown with a single gas cooling channel 310, it should be appreciated that the cooling plate 170 may have a number of gas cooling channels 310, each having a first and second end 312, 322, for cooling the gas cooled ESC assembly 252. The respective first ends 312 from the plurality of gas cooling channels may be attached to a manifold or have individual cooling lines 174. The respective second ends 322 may be likewise configured.

The cooling plate 170, having the gas cooling channels 310 formed as grooves in the copper plate 320 and brazed to the SST plate 340, increases the surface contact area between the cooling fluid and the ESC 152. The increased surface contact area enhances heat transfer between the ESC 152 and the cooling plate 170. The gas cooling channels 310, formed as grooves in the copper plate 320 in the gas cooled ESC assembly 252, can provide a longer cooling path than conventional water cooling lines used in conventional ESCs, for example up to about 86% longer. For example in similar sized 200 mm electrostatic chucks, the gas cooling channel 310 may be greater than about 20.0 inches long, for example about 23.1 inches long, whereas conventional cooling lines are about 12.4 inches long. The gas cooling channels 310 therefore provide a larger contact area with the gas cooled ESC assembly 252 for greater efficiency in removing heat from the substrates placed thereon.

In one embodiment, the longer gas cooling channels 310 carries $N_2$ gas to cool the ESC 152. The $N_2$ gas may be about 30 degrees Celsius and the flow of which is controlled by the variable gas flow control valve 210. The flow control valve 210, having the sensor with the digital output to the controller 180, establishes the flow rate of the $N_2$ gas. The $N_2$ gas exhausted from ESC is at about 200 degrees Celsius and, while passing through the heat exchanger 220, cools down to 30 degrees Celsius before being exhausted to lab environment.

Figure 4:
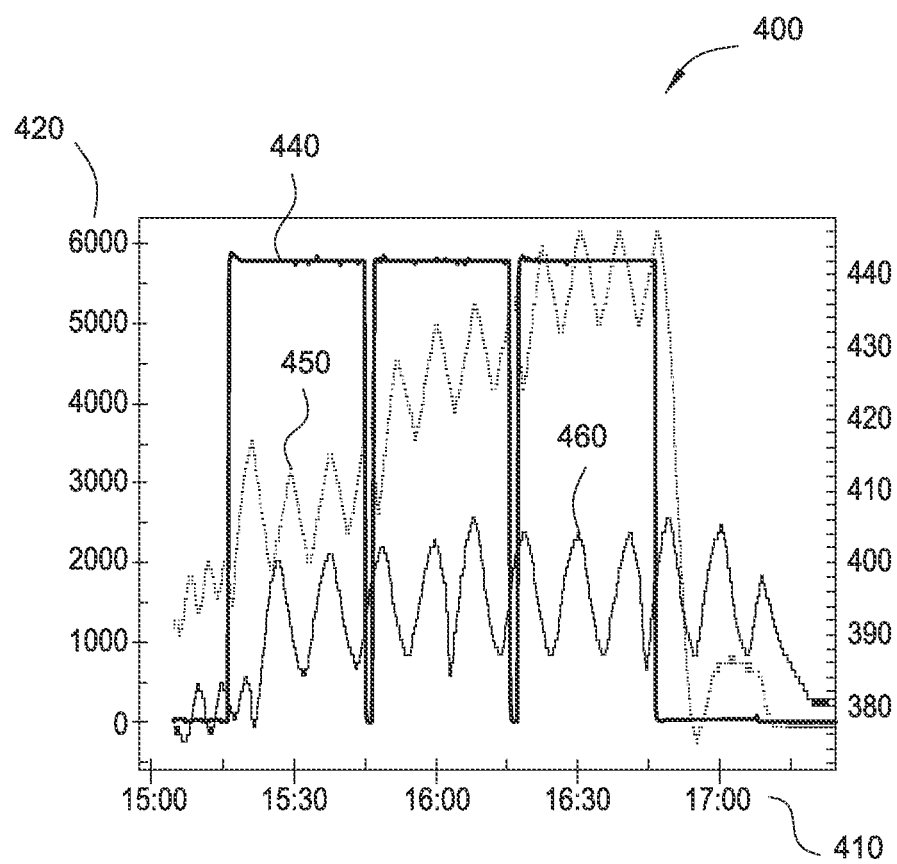
FIG. 4 is a graph depicting the temperature variation for the gas cooled electrostatic chuck over a period of time corresponding to multiple fabrication cycles.

FIG. 4 is a graph depicting temperature variations 420 for the gas cooled electrostatic chuck 252 over a period of time 410 corresponding to multiple fabrication cycles. The graph depicts three fabrication cycles wherein a first substrate is placed in the process chamber, processed, removed from the process chamber, and then a second and a third substrate repeats the cycle. It is desirable to maintain a stable temperature for the ESC. The cycling of the temperature in the graphs shown in FIG. 4 are actually an attempt to stabilize the temperature of the ESC during the deposition process. When the plasma is turned on the excess heat absorbed by the substrate and the ESC tend to continue to heat the substrate and ESC and exceed ideal temperature limits. The gas cooled ESC assembly 252 regulates the temperature to keep the temperature within the ideal temperature limits.

Line 440 depicts the ESC temperature. The ESC temperature varies between about 378 degrees Celsius and about 445 degrees Celsius. The ESC temperature is at about 445 degrees Celsius when the a substrate is in the chamber during processing. The line 440 for the ESC temperature drops to near 378 degrees Celsius when substrate processing is completed and as the substrate may be moved to and/or from the processing chamber.

For comparison, line 450 depicts temperature of an conventional ESC which is not cooled and run through 3 fabrication cycles for processing 3 substrates. The temperature of the conventional ESC (non-cooled) increases throughout the fabrication cycle. After just 3 runs, the temperature change for the conventional ESC can be seen at about 45 degrees Celsius above a desired processing set point temperature, Additionally, the temperature of the conventional ESC is also about 10 degrees above that for the conventional ESC during the processing the previous substrate. If the processing system keeps running, the conventional ESC will reach even higher temperatures resulting in damaged substrate and process variation.

Line 460 illustrates the temperature of the gas cooled ESC assembly 252. The temperature rise is much slower than that shown by line 450. The gas cooled ESC assembly 252 has a temperature change controlled to be within about 390° C. to 405° C. (±7.5 degrees C.). The temperature change illustrated while processing 3 substrates demonstrates that a consistent temperature may be maintained while processing 3 substrates as evidenced by a fairly stabilized temperature curve. The stabilized temperature curve is indicative of a more stable process which in turn result in more consistence quality the features, such as the MEMS, fabricated in the substrate.

Figure 5:
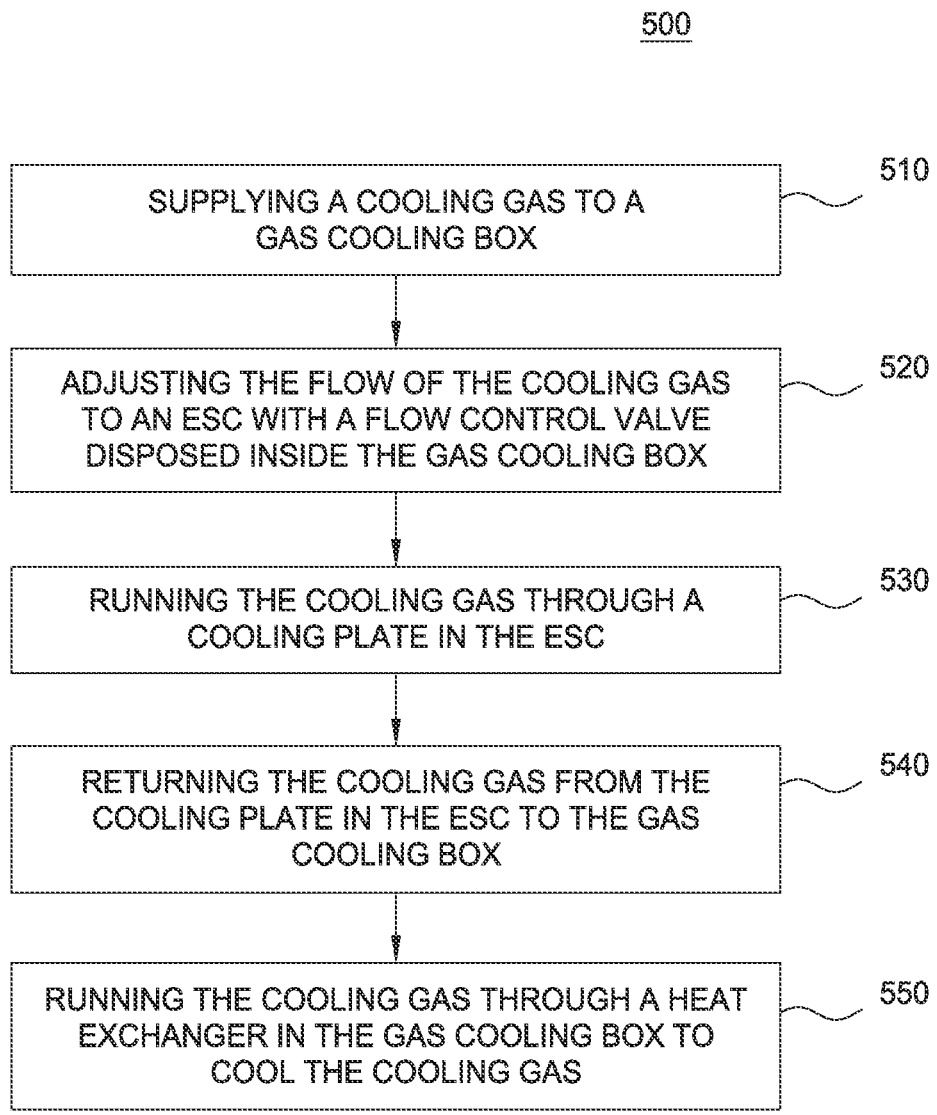
FIG. 5 illustrates a method for cooling a gas cooled electrostatic chuck.

FIG. 5 illustrates a method for controlling the temperature of a gas cooled ESC. The gas cooled ESC may be configured similar to the gas cooled ESC assembly 252 shown in FIG. 2. The method begins at operation 510 wherein a cooling gas is supplied to a gas cooling box. The cooling gas, such as $N_2$ or other suitable gas, may be supplied by a gas source at a temperature at about 30 degrees Celsius. At operation 520, the flow of the cooling gas to an ESC is adjusted with a flow control valve disposed inside the gas cooling box. The flow control valve may have I/O ports and be in communication with a controller. The controller may monitor the flow control valve for error conditions and adjust the flow rate for the cooling gas with the valve depending on other information processed by the controller.

At operation 530, the cooling gas is run through a cooling plate in the ESC. The cooling gas leaves the flow control valve and exits the gas cooling box from the gas cooling outlet. From the gas cooling outlet, the gas enters a first end of a gas cooling channel in a cooling plate of the ESC. The gas cooling channel may be a groove having a length of about 23.1" in length. The cooling gas is in contact with the ESC and heat is transferred from the ESC to the cooling gas. The gas cooling channel has a second end by which the now heated cooling gas leaves the cooling plate.

At operation 540, the cooling gas is returned from the cooling plate in the ESC to the gas cooling box. The now heated cooling gas enters the gas return inlet of the gas cooling box. At operation 550, the cooling gas is run through a heat exchanger in the gas cooling box to cool the cooling gas. The heat exchanger has a thermostat which is attached to the controller. The controller adjusts and monitors a flow controller for a cooling fluid. The cooling fluid, such as deionized water, enters the heat exchanger to remove heat from the cooling gas. The cooling gas leaves the heat exchanger at about 30 degrees Celsius. The cooling gas temperature is suitable for exhausting from the gas cooling box into the lab environment or reused for cooling or other purposes.

While the foregoing is directed to embodiments of the present invention, other and further embodiments of the invention may be devised without departing from the basic scope thereof, and the scope thereof is determined by the claims that follow.

What is claimed is:

1. A processing chamber comprising:
   a chamber body having walls, a lid and a bottom which defines an interior processing volume;
   a gas cooled electrostatic chuck assembly disposed in the processing volume of the chamber body, the gas cooled electrostatic chuck assembly having a cooling plate, the cooling plate having a gas channel with a first end and a second end; and
   a gas box having a gas return inlet, a gas return outlet, a cooling gas inlet, a heat exchanger coupled to the gas return inlet and the gas return outlet, and a cooling gas outlet, wherein the cooling gas outlet is coupled to the cooling gas inlet forming a single path through the gas box which is inaccessible to the heat exchanger, one or more isolation pads disposed on the heat exchanger isolating the heat exchanger from RF energy at the gas cooled electrostatic chuck the gas box configured to control a flow of a cooling gas from the cooling gas outlet to the first end of the gas channel in the cooling plate and receive at the gas return inlet the cooling gas from the second end of the gas channel in the cooling plate and wherein the return outlet exhausts to outside of the interior processing volume.

2. The processing chamber of claim 1, wherein the gas box further comprises:
   a flow control valve operable to control the flow of cooling gas through the gas channel.

3. The processing chamber of claim 1, wherein the gas box is operable to provide a temperature of about 30 degrees Celsius being exhausted outside of the interior processing volume.

4. The processing chamber of claim 1, wherein the gas box is operable to maintain a temperature of the electrostatic chuck within +/−7.5 degrees Celsius.

5. The processing chamber of claim 1, wherein the cooling plate is fabricated from copper.

6. The processing chamber of claim 1, wherein the gas channel formed in the cooling plate comprises a groove of about 20.0 inches long for a 200 mm ESC.

7. The processing chamber of claim 1, wherein the isolation pads are formed from a fluoropolymer.

8. The processing chamber of claim 7, wherein the heat exchanger comprises:
   a flow switch configured to regulate the flow of a secondary cooling fluid; and
   a thermal switch configured to sense an overheat condition in the heat exchanger.

9. The processing chamber of claim 1, wherein the gas cooled electrostatic chuck assembly is configured to operate at a temperature that includes a range of between about 378 degrees Celsius to about 445 degrees Celsius.

10. The processing chamber of claim 9, wherein the gas box is operable to control a flow of cooling gas through the gas channel to maintain a temperature of the electrostatic chuck between about 378 and about 445 degrees Celsius and the heat exchanger is configured to cool the cooling gas from about 200 degrees Celsius at the gas return inlet to a temperature of about 30 degrees Celsius at the gas return outlet configured for being exhausted to an environment outside of the interior processing volume.

11. An electrostatic chuck assembly comprising:
   an electrostatic chuck configured to operate at a temperature that includes a range of between about 378 degrees Celsius to about 445 degrees Celsius;
   a cooling plate disposed in contact with the electrostatic chuck, the cooling plate having a gas channel formed therein; and
   a gas box having a gas return inlet, a gas return outlet, a cooling gas outlet, a cooling gas inlet and a heat exchanger, the cooling gas outlet coupled to a first end of the gas channel in the cooling plate, the cooling gas outlet coupled through only a flow control valve to the cooling gas inlet wherein fluid flowing from the cooling gas inlet has only a single path through the gas box which is inaccessible to the heat exchanger, the gas return inlet coupled to a second end of the gas channel in the cooling plate, the gas return inlet coupled through the heat exchanger to the gas return outlet, the gas box operable to control a flow of cooling gas through the gas channel to maintain a temperature of the electrostatic chuck between about 378 and about 445 degrees Celsius and the heat exchanger is configured to cool the cooling gas from about 200 degrees Celsius at the gas return inlet to a temperature at the gas return outlet configured for being exhausted outside of an environment containing the electrostatic chuck assembly.

12. The electrostatic chuck assembly of claim 11, wherein the heat exchanger is isolated from the gas cooling box with one or more isolation pads configured to isolate the gas cooling box from RF power coming from the gas cooled electrostatic chuck.

13. The electrostatic chuck assembly of claim 11, wherein the gas box is operable to provide a temperature of about 30 degrees Celsius for the cooling gas at the gas return outlet.

14. The electrostatic chuck assembly of claim 11, wherein the gas box is operable to maintain a temperature of the electrostatic chuck within +/−7.5 degrees Celsius.

15. The electrostatic chuck assembly of claim 11, wherein the cooling plate is fabricated from copper.

16. The electrostatic chuck assembly of claim 11, wherein the gas channel formed in the cooling plate comprises a groove of about 20.0 inches long for a 200 mm ESC.

17. The electrostatic chuck assembly of claim 11, wherein the heat exchanger comprises:
   a flow switch configured to regulate the flow of a secondary cooling fluid;
   a thermal switch configured to sense an overheat condition in the heat exchanger; and
   an isolator formed from fluoropolymer pads to minimize heat transfer between the heat exchanger and the gas cooling box as well as isolating RF power from the ESC.

* * * * *